United States Patent [19]

Sorrow

[11] Patent Number: 4,678,890
[45] Date of Patent: Jul. 7, 1987

[54] HERMETICALLY SEALED METAL FILM RESISTOR

[75] Inventor: Billy B. Sorrow, Mineral Wells, Tex.

[73] Assignee: North American Philips Corporation, New York, N.Y.

[21] Appl. No.: 861,780

[22] Filed: May 9, 1986

[51] Int. Cl.$^4$ .............................................. B23K 26/00
[52] U.S. Cl. .......................... 219/121 L; 219/121 LD; 338/274
[58] Field of Search ................. 219/121 LC, 121 LD, 219/121 LE, 121 LF, 121 L, 121 LM; 338/272-274, 226, 234, 237, 332, 25; 29/610 R, 611, 613

[56] References Cited

U.S. PATENT DOCUMENTS

| | | | |
|---|---|---|---|
| 3,217,088 | 11/1965 | Steierman | 219/121 LD X |
| 3,244,559 | 4/1966 | Sivertsen et al. | 338/237 X |
| 3,688,238 | 8/1972 | Brady et al. | 338/237 |
| 3,934,073 | 1/1976 | Ardezzone | 219/121 LC X |
| 4,117,589 | 10/1978 | Francis | 29/619 |
| 4,446,502 | 5/1984 | Boser | 361/308 |

OTHER PUBLICATIONS

1984 Resistor/Capacitor Data Book, Mepco//Electra Inc., Morristown, N.Y., ©1984, pp. 522ff.

*Primary Examiner*—C. L. Albritton
*Attorney, Agent, or Firm*—Jack E. Haken; James J. Cannon, Jr.

[57] ABSTRACT

A heat sensitive electrical component is hermetically sealed within a glass sleeve by focusing a laser beam on the circumferential ends of the glass sleeve which abut the side wall edges of metal end caps on each opposed end of said component. The glass sleeve absorbs sufficient heat from the focused laser beam to avoid damage to the heat sensitive component.

8 Claims, 2 Drawing Figures

U.S. Patent     Jul. 7, 1987     4,678,890
FIG.1
PRIOR ART
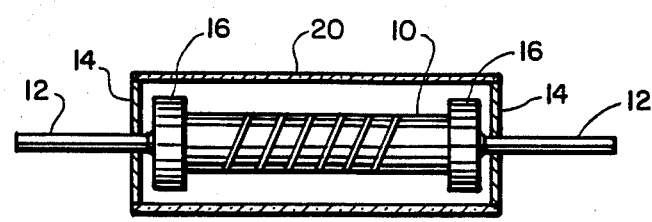
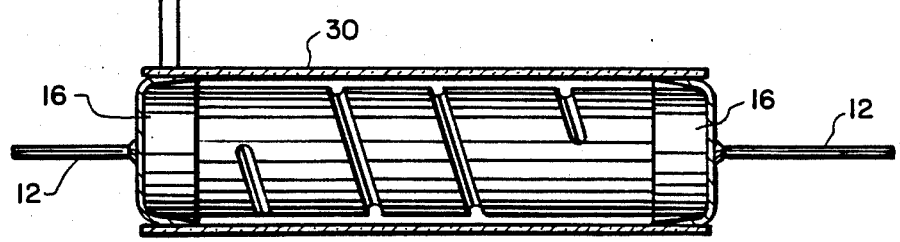
FIG.2

HERMETICALLY SEALED METAL FILM RESISTOR

BACKGROUND OF THE INVENTION

1. Field of the Invention

The invention pertains to small hermetically sealed, glass encapsulated electrical components and specifically to glass encapsulated components which are sensitive to the heat applied during the hermetic sealing process.

2. Description of the Prior Art

The construction of hermetcally sealed, glass encapsulated small components is known in the prior art. Examples of techniques not useful for temperature sensitive components are disclosed in U.S. Pat. No. 4,446,502. A technique for use with metal film resistors is disclosed in U.S Pat. No. 4,117,589.

A typical commercially available, hermetically sealed, glass encapsulated metal film resistor, available from Mepco/Centralab, Inc., is illustrated in FIG. 1. A finished metal film resistor 10 having axial leads 12 extending from metal end caps 16 has metal discs 14, typically of "Kovar TM", welded to each axial lead and spaced apart from the resistor end caps 16. A large diameter glass sleeve 20 is then heat sealed to the discs 14, which discs are spaced apart from the end caps 16 and larger in diameter than said end caps to keep the heat required for the hermetic seal away from the resistive metal film on resistor 10. This prior art device requires elaborate and complicated fabrication techniques to avoid overheating the resistive metal film. Such overheating causes deterioration of the film.

The object of the present invention is to eliminate the potential for overheating while providing a simpler, more reliable and structurally stable device.

SUMMARY OF THE INVENTION

The present invention is a hermetically sealed, glass encapsulated, heat sensitive electrical component, wherein the hermetic seal of the glass directly to a metal end cap of the component is accomplished without any adverse effect of heat on the heat sensitive component. The invention relies on the fact that the energy contained in a $CO_2$ laser beam is almost totally absorbed by common glass and that the $CO_2$ laser beam can be focused to a small area of concentration.

In the preferred embodiment, a glass sleeve is hermetically sealed directly to the circumferential side edges of the end caps of a metal film resistor. In the preferred embodiment, the same size metal film resistor has metal end caps surrounded by a glass sleeve of smaller diameter than the glass sleeve of the prior art design. A $CO_2$ laser beam is focused to concentrate on the circumferential ends of the glass sleeve abutting the side edges of the end caps. Heat is concentrated at each end of the glass sleeve and the laser beam quickly produces a glass-to-metal seal in the area between the circumferential end of the glass sleeve and the side edge of the metal end cap. Because of the concentrated energy of the laser beam, only enough heat is produced to provide the glass-to-metal seal. The resistive metal film, or any other heat sensitive component, is left unaffected.

The finished encapsulated component is simpler in construction and has better structural integrity than the prior art devices.

BRIEF DESCRIPTION OF THE DRAWINGS

FIG. 1 is a side view of a prior art, commercially available, hermetically sealed, glass encapsulated metal film resistor.

FIG. 2 is a side view of a hermetically sealed, glass metal film resistor using the present invention.

DESCRIPTION OF THE PREFERRED EMBODIMENT

The present invention is a hermetically sealed, glass encapsulated heat sensitive electrical component, wherein the hermetic seal of a glass sleeve to metal end caps of the component is accomplished without any adverse effect of heat on the heat sensitive component. The invention relies on the fact that the energy contained in a $CO_2$ laser beam is almost totally absorbed by common glass and that the $CO_2$ laser beam can be focused to a small area of concentration.

In the preferred embodiment, illustrated in FIG. 2, a metal film resistor 10 having axial leads 12 and metal end caps 16 is surrounded by a glass sleeve 30, which is hermetically sealed directly to the side edges of the end caps 16, dispensing with the need for discs 14 of FIG. 1. In the preferred embodiment of FIG. 2, the same metal film resistor 10 is surrounded by a glass sleeve 30 of smaller diameter than the glass sleeve 20 of FIG. 1. A $CO_2$ laser beam is focused to concentrate on each circumferential end of the glass sleeve 30 abutting the side edge of metal end cap 16. Heat is concentrated at the end of the glass sleeve 30 and the laser beam quickly produces a glass-to-metal seal in the area between the end of the glass sleeve 30 and the side edge of end cap 16. Because of the concentrated energy of the laser beam, only enough heat is produced to provide the glass-to-metal seal. The resistive metal film, or any other heat sensitive component, is left unaffected.

As is evident from the drawings, the finished encapsulated component is simpler in construction and has better structural integrity than the prior art devices.

Since the glass-to-metal seal is made directly between the glass sleeve 30 and the side edges of end caps 16, there is no need for the metal discs 16 on the axial leads 12 and a smaller size glass sleeve can be utilized. The preferred embodiment is a smaller and physically stronger hermetically sealed metal film resistor than the prior art device.

In an alternate embodiment, a YAG laser could be used if the glass sleeve is made from an infrared absorbing glass.

The preferred embodiment is described with respect to a cylindrically shaped package. It should be obvious that any other shape capable of a hermetic seal could be used.

What is claimed is:

1. A hermetically sealed, glass encapsulated heat sensitive electrical component having metal end caps at opposed ends thereof, comprising:
   a glass sleeve sized to surround said component and having circumferential ends abutting said metal end caps;
   a hermetic seal between the circumferential ends of said glass sleeve and the side edges of said end caps, said seal being made by a focused laser beam.

2. The component of claim 1 wherein said component is a metal film resistor.

3. The component of claim 1 wherein said focused laser beam is from a $CO_2$ laser.

4. The component of claim 1 wherein said glass is an infrared absorbing glass and said focused laser beam is from a YAG laser.

5. A method for hermetically sealing a glass encapsulated heat sensitive component having metal end caps at opposed ends thereof, comprising the steps of:
- enclosing said component in a glass sleeve, each, circumferential end thereof which fitting snugly about the side perimeter of an end cap of said component, leaving a surface of said end cap exposed for electrical connections thereto;
- rotating said component enclosed in said glass sleeve;
- focusing a laser beam on each end of said glass sleeve at a position where said glass sleeve overlaps said end cap while rotating said component, until each end cap is hermetically sealed to said glass sleeve.

6. The method of claim 5 wherein said component is a metal film resistor.

7. The method of claim 5 wherein said laser beam is from a $CO_2$ laser and said glass sleeve is common glass.

8. The method of claim 5 wherein said laser beam is from a YAG laser and said glass sleeve is an infrared absorbing glass.

* * * * *